United States Patent
Suvorov

(12) 
(10) Patent No.: US 8,216,924 B2
(45) Date of Patent: Jul. 10, 2012

(54) METHODS OF FABRICATING TRANSISTORS USING LASER ANNEALING OF SOURCE/DRAIN REGIONS

(75) Inventor: Alexander V. Suvorov, Durham, NC (US)

(73) Assignee: Cree, Inc., Durham, NC (US)

(*) Notice: Subject to any disclaimer, the term of this patent is extended or adjusted under 35 U.S.C. 154(b) by 316 days.

(21) Appl. No.: 12/580,633

(22) Filed: Oct. 16, 2009

(65) Prior Publication Data

US 2011/0092057 A1    Apr. 21, 2011

(51) Int. Cl.
H01L 21/265   (2006.01)
H01L 21/26    (2006.01)
H01L 21/336   (2006.01)
H01L 21/8234  (2006.01)
H01L 21/337   (2006.01)

(52) U.S. Cl. ........ 438/522; 438/795; 438/191; 438/197; 438/308

(58) Field of Classification Search .............. 438/795, 438/522, 166, 172, 174, 186, 191, 197, 199, 438/783, 234, 235, 249, 306, 308, 312, 313, 438/602–604, 381, 392, 372
See application file for complete search history.

(56) References Cited

U.S. PATENT DOCUMENTS

| | | | |
|---|---|---|---|
| 6,316,793 B1 | 11/2001 | Sheppard et al. | |
| 6,548,333 B2 | 4/2003 | Smith | |
| 6,849,882 B2 | 2/2005 | Chavarkar et al. | |
| 6,982,204 B2 | 1/2006 | Saxler et al. | |
| 2004/0106239 A1* | 6/2004 | Nakajima et al. | 438/151 |
| 2005/0170574 A1 | 8/2005 | Sheppard et al. | |
| 2007/0275510 A1* | 11/2007 | Chen et al. | 438/142 |
| 2009/0242944 A1* | 10/2009 | Zhang et al. | 257/288 |

OTHER PUBLICATIONS

Pan et al, "Excimer Laser Annealing of ZnO Nanoparticles for Thin Film Transistor Fabrication" *Proc. of International Congress on Applications of Lasers & Electro-Optics, The*, ICALEO 2008 Paper No. M904 (2008).
Whelan et al. "Radiation damage annealing (thermal and laser) in Mg implanted GaN" *Phys. Stat. Sol. (c)* 2(7):2472-2475 (2005.

* cited by examiner

*Primary Examiner* — Chuong A. Luu
(74) *Attorney, Agent, or Firm* — Myers Bigel Sibley & Sajovec, P.A.

(57) ABSTRACT

Fabrication of a Group III-nitride transistor device can include implanting dopant ions into a stacked Group III-nitride channel layer and Group III-nitride barrier layer to form source/drain regions therein with a channel region therebetween. The channel layer has a lower bandgap energy than the barrier layer along a heterojunction interface between the channel layer and the barrier layer. The source/drain regions have a lower defect centers energy than the channel region. The source/drain regions and the channel region are exposed to a laser beam with a wavelength having a photon energy that is less than the bandgap energy of the channel region and higher than the defect centers energy of the source/drain regions to locally heat the source/drain regions to a temperature that anneals the source/drain regions.

16 Claims, 3 Drawing Sheets

METHODS OF FABRICATING TRANSISTORS USING LASER ANNEALING OF SOURCE/DRAIN REGIONS

FIELD OF THE INVENTION

The present invention relates to microelectronic devices, and, more particularly, to processes for fabricating transistors.

BACKGROUND

Materials such as silicon (Si) and gallium arsenide (GaAs) have found wide application in semiconductor devices for lower power and, in the case of Si, lower frequency applications. However, these more familiar semiconductor materials may not be well suited for higher power and/or high frequency applications, for example, due to their relatively small bandgaps (e.g., 1.12 eV for Si and 1.42 for GaAs at room temperature) and/or relatively small breakdown voltages.

In light of various difficulties in the fabrication/operation of Si and GaAs devices for high power, high temperature and/or high frequency applications, interest has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and/or silicon.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped ("unintentionally doped") smaller bandgap material, and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and relatively high carrier mobility can give the HEMT a relatively large transconductance, and may provide a performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

One of the continuing challenges to fabricating HEMT devices having ideal operational characteristics is maintaining high conductivity channel regions during the high temperature processes typically used during their fabrication processes.

SUMMARY

Some embodiments of the present invention are directed to methods of forming a Group III-nitride transistor device. Dopant ions are implanted into a stacked Group III-nitride channel layer and Group III-nitride barrier layer to form source/drain regions therein with a channel region therebetween. The channel layer has a lower bandgap energy than the barrier layer along a heterojunction interface between the channel layer and the barrier layer. The source/drain regions have a lower defect centers energy than the channel region. The source/drain regions and the channel region are exposed to a laser beam with a wavelength having a photon energy that is less than the bandgap energy of the channel region and higher than the defect centers energy of the source/drain regions to locally heat the source/drain regions to a temperature that anneals the source/drain regions.

Because the photon energy of the laser beam bandwidth is less than the bandgap energy of the channel region, the channel region can be substantially transparent to the laser beam and, therefore, may not be significantly heated during the exposure. In sharp contrast, the photon energy of the laser beam wavelength is greater than the defect centers energy of the source/drain regions and is absorbed in sufficient quantities to raise the temperature of the source/drain regions to cause annealing of the implanted dopant ions.

Some other embodiments of the present invention are directed to methods of forming a Group III-nitride transistor device in which dopant ions are implanted into a stacked channel layer comprising gallium nitride and a barrier layer comprising aluminum gallium nitride to form source/drain regions therein with a channel region therebetween. The source/drain regions and the channel region are exposed to a laser beam with a wavelength having a photon energy that is less than a bandgap energy of the channel region and higher than a defect centers energy of the source/drain regions to locally heat the source/drain regions to a temperature that anneals the source/drain regions.

Some other embodiments of the present invention are directed to a method of forming a semiconductor device in which dopant ions are implanted into a layer to form source/drain regions therein with a channel region therebetween. The source/drain regions are laser annealed to activate the dopant ions without substantially reducing conductivity of the channel region.

The semiconductor device may include a stacked Group III-nitride channel layer and Group III-nitride barrier layer. The dopant ions may be implanted into the channel layer and the barrier layer to form the source/drain regions therein with the channel region therebetween. The source/drain regions and the channel region may be exposed to a laser beam that locally heats and activates the dopant ions in the source/drain regions while the adjacent channel region remains at a substantially lower temperature than the source/drain regions.

Some other embodiments of the present invention are directed to a method of forming a semiconductor device. The semiconductor device includes a pair of implanted regions and a non-implanted region therebetween. The semiconductor device including the pair of implanted regions and the non-implanted region is exposed to a laser beam to anneal and activate the implanted regions.

Other methods, systems, and/or computer program products according to embodiments of the invention will be or become apparent to one with skill in the art upon review of the following drawings and detailed description. It is intended that all such additional methods, systems, and/or computer program products be included within this description, and be within the scope of and protected by the accompanying claims. Moreover, it is intended that all embodiments disclosed herein can be implemented separately or combined in any way and/or combination.

BRIEF DESCRIPTION OF THE DRAWINGS

The accompanying drawings, which are included to provide a further understanding of embodiments of the invention and are incorporated in and constitute a part of this application. In the drawings.

DETAILED DESCRIPTION OF EMBODIMENTS

Figure 1:
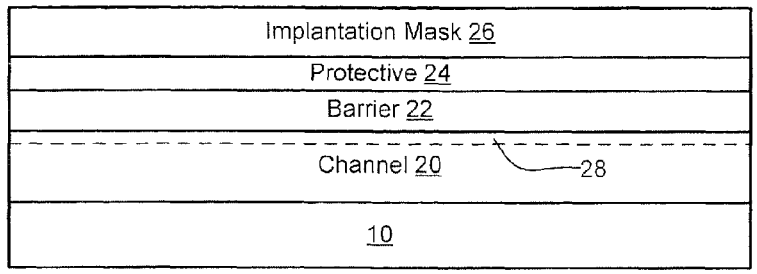
FIGS. 1 to 4 are cross-sectional views that illustrate various operations that may be carried out to fabricate a transistor device using a laser beam to locally heat source/drain regions thereof in accordance with some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Embodiments of the present invention may be particularly well suited for use in nitride-based HEMTs, such as Group III-nitride based devices. As used herein, the term "Group III-nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. The Group III elements can be combined with nitrogen to form binary (e.g., GaN), ternary (e.g., AlGaN, AlInN), and quaternary (e.g., AlInGaN) compounds. These compounds may all have empirical formulas in which one mole of nitrogen is combined with a total of one mole of the Group III elements. Accordingly, formulas such as $Al_xGa_{1-x}N$, where $0 \leq x \leq 1$, may be used to describe these compounds.

Suitable structures for GaN-based HEMTs that may utilize embodiments of the present invention are described, for example, in commonly assigned U.S. Pat. No. 6,849,882, and U.S. Pat. No. 6,982,204 the disclosures of which are hereby incorporated herein by reference in their entirety.

The operational characteristics of a transistor device can become substantially degraded during its fabrication by processes that expose the channel region to high temperatures during annealing of the source/drain regions. Such heating of the channel region may increase the resistance of the channel region and/or decrease the mobility of the charge carriers in the channel region. Implantation of dopant ions into a semiconductor layer to form the source/drain regions introduces defect centers into the lattice structures of the source/drain regions. Some embodiments may arise from the present realization that these defect centers cause the source/drain regions to have a substantially different transmissivity to certain light wavelengths than the channel region.

Consequently, localized heating of the source/drain regions may be achieved so that the source/drain regions are heated substantially more than the channel region, by exposing the source/drain regions and the channel region to a laser beam with a wavelength having a photon energy that is less than the bandgap energy of the channel region and higher than the defect centers energy of the source/drain regions. The channel region may thereby be substantially transparent to the laser beam while, in sharp contrast, the source/drain regions may absorb the laser beam resulting is heating thereof. The source/drain regions may thereby be heated to a sufficient temperature that anneals the defect centers and activate impurity ions therein while the temperature of channel region remains sufficiently low to avoid degradation of the channel region (e.g., to avoid a substantial increase in resistance and/or a substantial decrease in charge carrier mobility in the channel region).

FIGS. 1 to 4 are cross-sectional views that illustrate various operations that may be carried out to fabricate a transistor device using a laser beam to locally heat source drain regions thereof in accordance with some embodiments of the present invention. Referring now to FIG. 1, a substrate layer 10 is provided on which a transistor device may be formed. A channel layer 20 is formed on the substrate layer 10, and a barrier layer 22 is formed on the channel layer 20.

The substrate layer 10 may be a semi-insulating silicon carbide (SiC) substrate that may be, for example, a 4H polytype of silicon carbide. Other silicon carbide candidate polytypes may include 3C, 6H, and 15R polytypes. The term "semi-insulating" is used descriptively herein, rather than in an absolute sense. In some embodiments of the present invention, the silicon carbide bulk crystal may have a resistivity equal to or higher than about $1 \times 10^5$ Ω-cm at room temperature.

Silicon carbide has a much closer crystal lattice match to Group III nitrides (which may be employed in the channel layer 20 and/or the barrier layer 22) than does sapphire (Al2O3), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance. Exemplary SiC substrates that may be used in some embodiments of the present invention are manufactured by, for example, Cree, Inc., of Durham, N.C., the assignee of the present invention.

It is to be understood that, although silicon carbide may be employed as the substrate layer 10, embodiments of the present invention may utilize any suitable substrate for the substrate layer 10, such as sapphire (Al2O3), aluminum nitride (AlN), aluminum gallium nitride (AlGaN), gallium nitride (GaN), silicon (Si), gallium arsenide (GaAs), Lu2O3/Ga2O3 (LGO), zinc oxide (ZnO), Lu2O3/Al2O3 (LAO), indium phosphide (InP), and the like. It will be further understood that the presence of a growth substrate is optional, and the epitaxial layers of the device, including the channel layer 20 and the barrier layer 22 can be removed from a growth substrate and mounted on a carrier substrate, submount, package body or other support that may provide more suitable mechanical, thermal and/or electrical characteristics. Accordingly, the substrate layer 10 may be omitted from the subsequent figures.

Optional buffer, nucleation and/or transition layers (not shown) may also be provided on the substrate layer 10. For example, an AlN buffer layer may be formed thereon to provide an appropriate crystal structure transition between a silicon carbide substrate and the remainder of the device. Additionally, strain balancing transition layer(s) may also be formed on the substrate layer 10.

Still referring to FIG. 1, a channel layer 20 is provided on the substrate layer 10. The channel layer 20 may be deposited on the substrate layer 10 using buffer layers, transition layers, and/or nucleation layers as described above. The channel layer 20 may be under compressive strain. Furthermore, the channel layer 20 and/or buffer, nucleation, and/or transition layers may be deposited by metal-organic chemical vapor deposition (MOCVD) or by other techniques known to those of skill in the art, such as molecular beam epitaxy (MBE) and/or hydride vapor phase epitaxy (HVPE). In some embodiments of the present invention, the channel layer 20 may be a Group III-nitride layer, such as GaN. The channel layer 20 may also include other Group III-nitride layers, such as indium gallium nitride (InGaN), aluminum indium gallium nitride (AlInGaN), or the like. The channel layer 20 may be undoped (i.e., "unintentionally doped"), and may be grown to a thickness of greater than about 20 Å. The channel layer 20 may also be a multi-layer structure, such as a superlattice or combinations of GaN, AlGaN, or the like.

As further shown in FIG. 1, a barrier layer 22 is provided on the channel layer 20. For example, the barrier layer 22 may be epitaxially formed on the channel layer 20. The barrier layer 22 may be a Group III-nitride layer, such as $Al_xGa_{1-x}N$ (where $0<x<1$). The barrier layer 22 may also include other Group III-nitride layers, such as AlInGaN, AlN, and/or combinations of layers thereof. The barrier layer 22 may, for example, be from about 0.1 nm to about 100 nm thick, but should not be so thick as to cause cracking or substantial defect formation therein. In certain embodiments of the present invention, the barrier layer 22 may be a highly-doped n-type layer. For example, the barrier layer 22 may be doped to a concentration of less than about $10^{19}$ cm$^{-3}$.

Some embodiments of the present invention may be applicable for use in high electron mobility transistors (HEMTs). More particularly, the channel layer 20 and the barrier layer 22 may be formed of materials having different bandgap energies, such that an interface between the channel layer 20 and the barrier layer 22 defines a heterojunction. A two-dimensional electron gas (2DEG) region 28 can thereby be formed at the heterojunction in the lower bandgap energy one of the channel layer 20 and the barrier layer 22.

For example, the channel layer 20 may have a bandgap that is less than the bandgap of the barrier layer 22. As such, the energy of the conduction band edge of the channel layer 20 may be less than the energy of the conduction band edge of the barrier layer 22 at the junction between the channel 20 and barrier 22 layers, and the channel layer 20 may have a greater electron affinity than the barrier layer 22 to form the 2DEG region 28 therein. For example, where both the channel layer 20 and the barrier layer 22 are formed of Group III-nitride layers, the channel layer 20 may be a GaN layer, and the barrier layer 22 may be a AlGaN layer. Examples of layers according to certain embodiments of the present invention are described in U.S. Pat. No. 6,849,882.

In particular embodiments of the present invention, the barrier layer 22 may have a thickness, Al composition, and/or doping that is sufficient to induce a significant carrier concentration at the heterojunction interface between the channel layer 20 and the barrier layer 22 through polarization effects when the barrier layer 22 is buried under ohmic contact metal. Also, the barrier layer 22 may be thick enough to reduce or minimize scattering of electrons in the channel due to ionized impurities deposited at the interface between the barrier layer 22 and a subsequently formed protective layer.

In addition, in other embodiments of the present invention, the channel layer 20 and the barrier layer 22 may have different lattice constants. For example, the barrier layer 22 may be a relatively thin layer having a smaller lattice constant than the channel layer 20, such that the barrier layer 22 "stretches" at the interface between the two. Accordingly, a pseudomorphic HEMT (pHEMT) device may be provided.

As further illustrated in FIG. 1, a protective layer 24 transparent to laser beam may be formed on the barrier layer 22. The protective layer 24 may be dielectric material, such as silicon nitride (SixNy) (Eg=5.1 eV), aluminum nitride (AlN) (Eg=6.3 eV), silicon dioxide (SiO2) (Eg=9.0 eV), and/or other suitable material that functions to inhibit emission of nitrogen from the barrier layer while source/drain regions are annealed.

The protective layer 24 may be blanket formed on the barrier layer 22. For example, the protective layer 24 may be a silicon nitride (SiN) (Eg=5.1 eV) layer formed by high quality sputtering and/or plasma-enhanced chemical vapor deposition (PECVD). The protective layer 24 may have a thickness of about 1 nm, however, other thickness layers may also be utilized to protect the underlying barrier layer 24 while allowing laser annealing of the source/drain regions. For example, the protective layer 24 may have a thickness of from about 1 nm to about 500 nm. A high quality SiN protective layer may be grown in-situ with MOCVD growth of a Group III nitride channel layer 20 and a Group III nitride barrier layer 22.

In particular embodiments of the present invention, the protective layer 24 may be SiN. The SiN protective layer may be formed by PVD and/or CVD and may be non-stoichiometric in compressive or tensile strain. For example, the SiN protective layer may have a stress of between about −100 MPa and about 100 MPa. In certain embodiments of the present invention, the SiN protective layer may have an index of refraction at a 633 nm wavelength of from about 1.6 to about 2.2. In particular embodiments, the index of refraction of the SiN protective layer may be 1.98±0.05.

Figure 2:
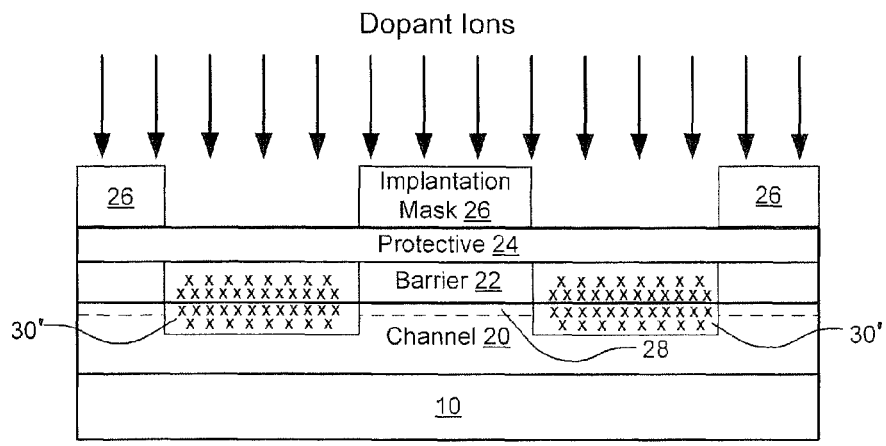

Referring now to FIG. 2 in combination with FIG. 1, an implantation mask layer 26 is provided on the protective layer 24. The implantation mask layer 26 is patterned, such as by photolithography or e-beam lithography and associated etching process, to provide implantation windows. The implantation mask layer 26 may include a material, such as silicon dioxide, aluminum nitride and/or another insulating material, that has an etch selectivity relative to the material of the protective layer 24. Furthermore, the implantation mask layer 26 may be formed to have a thickness that is sufficient to function as an implant mask in a subsequent process step.

Dopant ions are then implanted through the protective layer 24 and into the channel layer 20 and the barrier layer 22 to define source/drain regions 30'. During the source/drain implantation, the implantation mask 26 functions to define the lateral positioning of the source/drain regions 30' relative with a channel region extending therebetween.

In particular, dopant ions are implanted through the windows in the implantation mask 26 so that at least a portion of the implanted ions come to rest within the barrier layer 22. In addition, some of the implanted ions may come to rest within the channel layer 20. In some cases, the implanted ions form a concentration profile having a peak near the interface between the barrier layer 22 and the channel layer 20. However, the implant peak may be placed away from (i.e. above or below) the interface between the barrier layer 22 and the channel layer 20. Accordingly, as shown in FIG. 2, the implanted region 30' may be formed within the barrier layer 22 and/or the channel layer 20. In order to form n-type implanted regions in a nitride-based layer, the implanted ions may include silicon, although sulfur ions, oxygen ions, and/or other ions may be used.

The implant conditions may be selected so that the implanted region 30' has a peak dopant concentration of $1\times10^{18}$ cm$^{-3}$ or greater. For example, in some embodiments, the dose and energy of the implants may be selected to provide a peak dopant concentration of about $5\times10^{19}$ cm$^{-3}$. The implant process may include multiple implant steps to provide a net profile of implanted dopants. For example, the implant process may include a first implant step performed under a first set of implant conditions and a subsequent implant step performed under a second set of implant conditions. More than two implant steps may be performed.

Figure 3:
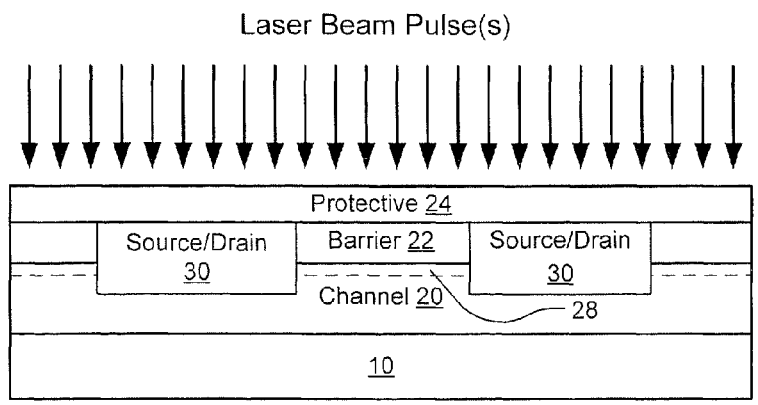

Referring to FIG. 3, after formation of the implanted source/drain regions 30', the mask 26 can be removed and the implanted source/drain regions 30' are exposed to one or more laser beam pulses having a wavelength with a photon energy that is less than the bandgap energy of the channel region 20 and higher than the defect centers energy of the implanted source/drain regions 30'. The pulse intensity and duration is regulated to locally heat the source/drain regions to a temperature that anneals the implanted source/drain regions 30' to formed annealed source/drain regions 30 while the temperature of channel region remains sufficiently low to avoid degradation of the channel region (e.g. avoid a substantial increase in resistance and/or a substantial decrease in charge carrier mobility in the channel region).

In some embodiments, the source/drain regions 30' and the channel region are exposed to a laser beam pulse with a wavelength between about 380 nm and about 600 nm to locally heat the source/drain regions 30' to sufficient temperature that anneals the defects and activate implanted dopant ions therein. In a more particular embodiment, the source/drain regions 30' and the channel region are exposed to a laser beam pulse with a wavelength of about 380 nm. The laser beam may be generated by an excimer laser apparatus, although another laser apparatus that can generate a laser beam pulse having at least some of the characteristics described herein may be used.

A laser beam wavelength in these ranges may be particularly advantageous for use when the channel layer 20 comprises gallium nitride and the barrier layer 22 comprises aluminum gallium nitride. For example, it has been determined that a laser beam wavelength of about 380 nm has a photon energy that is less than the bandgap energy of the channel region and, therefore, the channel region is substantially transparent to that laser beam wavelength. It has further been determined that, in sharp contrast to the channel region, the laser beam wavelength of about 380 nm has a photon energy that is greater than the bandgap energy of the source/drain regions 30 and, therefore, sufficient quantities of the laser beam can be absorbed so as to sufficiently heat the source/drain regions 30 to cause annealing of the implanted region and activate dopant ions.

In some embodiments, the wavelength, intensity, and/or duration are regulated to heat the source/drain regions 30' to a temperature of about 1000° C. to about 1300° C. while at least a majority of the channel region remains below 1000° C. The implanted dopant ions in the source/drain regions 30' may thereby be annealed to form annealed source/drain regions 30 while significant degradation of the channel region is avoided. In some further embodiments, the source/drain regions may be heated to a temperature within a range between 1080° C. and 1120° C. to anneal the implanted region and activate dopant ions.

As explained above and indicated in FIG. 3, one or more laser beam pulses may be used to anneal the source/drain regions 30. Operations for carrying out the laser annealing using it sequence of laser beam pulses be described below with regard to FIGS. 6-8.

In some alternate embodiments, the implantation mask 26 can be used both to define the locations of the source/drain regions 30' during ion implantation and to mask adjacent regions during the laser annealing of the source/drain regions 30'. Accordingly, following the ion implantation process, the implantation mask 26 may remain during the laser beam annealing processes described herein. The implantation mask 26 may be particularly useful for protecting the channel region and other regions that are adjacent to the source/drain regions 30' from excessive heating when a laser beam with an energy that is substantially greater than 3.2 eV is used to anneal the source/drain regions 30'. In some further embodiments, the ion implantation process and the laser beam annealing process may be carried out at least partially concurrent in time. Accordingly, the ion implantation and laser beam annealing processes may be carried out in-situ within a chamber (e.g., without breaking vacuum lock).

Before laser annealing of the source/drain regions 30' is carried out, the stacked structure of layers 10, 20, 22, and 24 may be preheated (e.g., within a furnace). Preheating the stacked structure reduces a relatively large temperature gradient that may otherwise result when the source/drain regions 30' are rapidly heated by a laser beam to elevated temperatures while the channel region extending therebetween remains at a substantially lower temperature. The stacked structure may, for example, be preheated to above about 100° C. and maintained at one or more temperatures above about 100° C. while the source/drain regions 30' are exposed to a laser beam pulse, thereby reducing the temperature gradient between the laser heated source/drain regions 30' regions and the peripheral regions of the stacked structure including the channel region. In some other embodiments, the stacked structure may be preheated and maintained at one or more temperatures above at least 500° C. to further reduce the temperature gradient during the laser annealing of the source/drain regions 30'.

Figure 4:
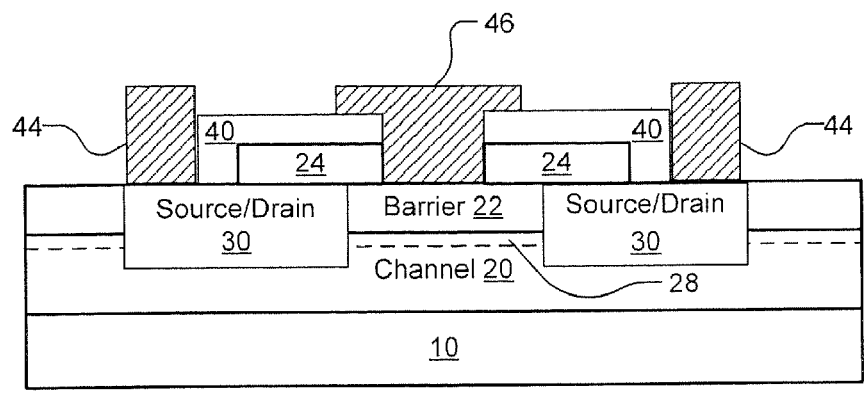

Referring to FIG. 4, following annealing of the source drain regions 30, the protective layer 24 may be removed or patterned. In the exemplary embodiment of FIG. 4, the protective layer 24 has been patterned to expose contact areas over the source/drain regions 30 and a contact area over the channel region. Source/drain contacts 44 are formed on the source/drain regions 30 and a gate electrode 46 is formed on the channel region. An insulation layer 40 may be formed on the protective layer 24 to further isolate the source/drain contacts 44 and the gate electrode 46 and to insulate the surface of the source/drain regions 30 and/or the channel region.

Suitable metals that may be used for the source/drain contacts 44 and/or the gate electrode 46 may include refractory metals, such as titanium (Ti), tungsten (W), titanium tungsten (TiW), silicon (Si), titanium tungsten nitride (TiWN), tungsten silicide (WSi), rhenium (Re), Niobium (Nb), nickel (Ni), gold (Au), aluminum (Al), tantalum (Ta), molybdenum (Mo), nickel silicide (NiSi), titanium silicide (TiSi), titanium nitride (TiN), tungsten silicon nitride (WSiN), and/or platinum (Pt) and the like.

The source/drain contacts 44 and the gate electrode 46 may be thermally annealed to form more suitable ohmic contact to the respective source/drain regions 30 and the channel region of the barrier layer 22. The anneal may be a relatively high temperature anneal. For example, the anneal may be performed at a temperature of greater than about 900° C. By using such an ohmic contact anneal, the resistance of the ohmic contact regions 30 may be reduced from a relatively high resistance to, for example, less than about 1 Ω-mm. Thus, as used herein, the term "ohmic contact" may refer to a non-rectifying contact that has a contact resistance of less than about 1 Ω-mm. The presence of the protective layer 24 during the high temperature process steps may reduce and/or inhibit damage to the barrier layer 22 and the source/drain regions 30 that may be caused by such steps. Thus, for example, the sheet resistance of the gate region (i.e., the length of the channel between the source/drain regions 30) after the high temperature ohmic contact anneal may be substantially the same as the sheet resistance of the gate region as-grown (i.e., before the contact anneal). It will be appreciated that, in some embodiments, it may not be necessary to anneal the deposited metal in order to form the source/drain contacts 44 and the gate electrode 46.

Figure 5:
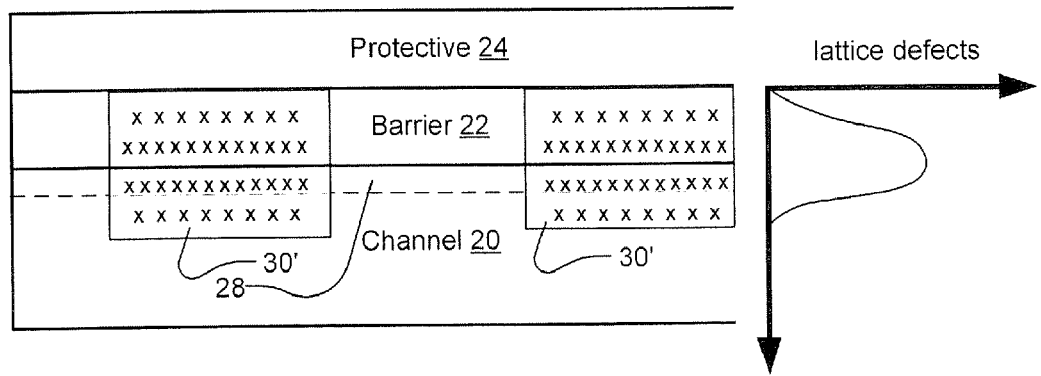
FIG. 5 is a cross-sectional view illustrating an exemplary distribution of lattice defect density in the source/drain regions of a transistor device due to implantation of dopant ions therein in accordance with some embodiments of the present invention.

As was explained above with regard to FIG. 2, the dopant ions can be implanted so as to form a concentration profile having a peak near the interface between the barrier layer 22 and the channel layer 20. The lattice defect density may correspond to the dopant concentration profile. FIG. 5 is a cross-sectional view of the device structure shown in FIG. 2 after implantation of the dopant ions, and illustrates an exemplary distribution of the lattice defect density in the source/drain regions 30' of the device results from the implanted dopant ions.

In some embodiments, the source/drain regions 30 are annealed by exposing them to a sequence of laser beam pulses that are spaced apart in time. Each pulse may be primarily absorbed by different portions of the source/drain regions 30 and, therefore, can primarily anneal that portion. For example, depending upon the photon energy provided by the laser beam wavelength relative to the defect centers energy distribution created by the defects in the source/drain regions 30, the defect centers may be annealed in a top-down sequential manner by the sequence of laser beam pulses. Alternatively, depending upon the laser beam pulse wavelengths, the defect centers may be sequentially annealed from a region having a highest dopant concentration (e.g., from the interface region between the barrier layer 22 and the channel layer 20 within the source/drain regions 30) outward to regions having successively lower dopant concentrations.

Figure 6:
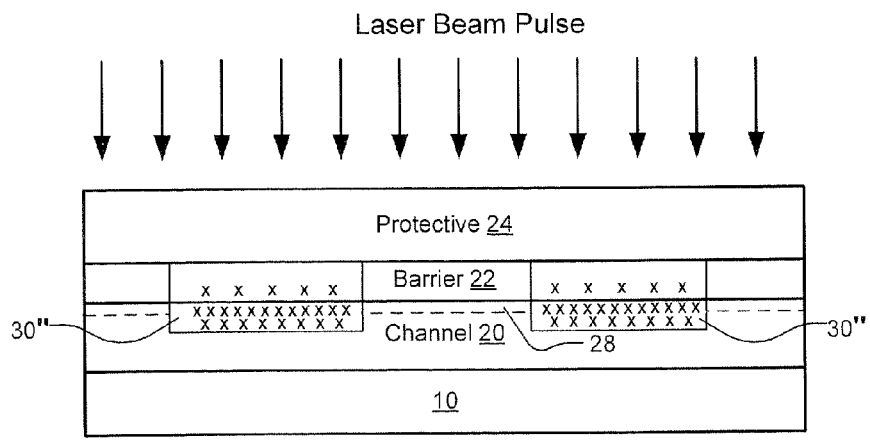
FIGS. 6-8 are cross-sectional views that illustrate various operations for fabricating a transistor device using a sequence of laser beam pulses to anneal defects and activate dopant ions that have been implanted into source/drain regions in accordance with some embodiments of the present invention.
Figure 7:
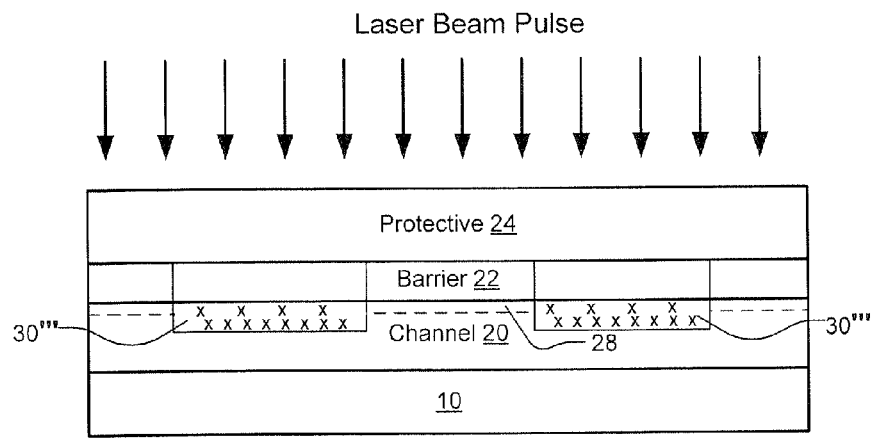
Figure 8:
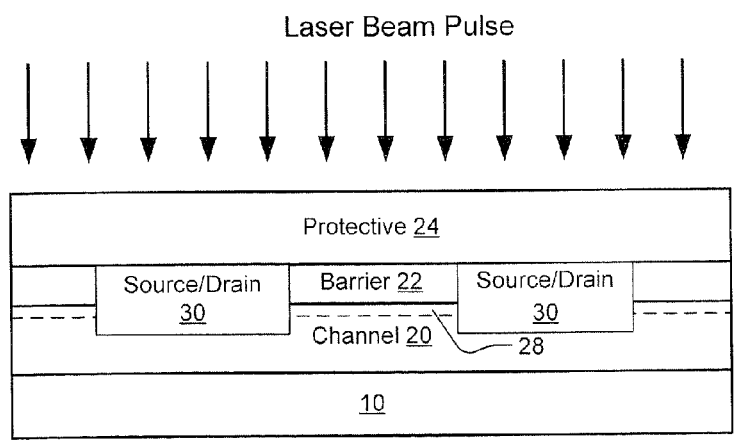

FIGS. 6-8 are cross-sectional views that illustrate various operations for fabricating a transistor device using a sequence of laser beam pulses to sequentially anneal different portions of the source/drain regions 30' in accordance with some embodiments of the present invention. The sequence of laser beam pulses are spaced apart in time and have one or more wavelengths each with a photon energy that is less than the bandgap energy of the channel region and higher than the defects centers energy of the source/drain regions 30' to sequentially thermally anneal different portions of the source/drain regions 30'.

Referring to FIG. 6, a first laser beam pulse is generated which has a wavelength with a photon energy that is less than the bandgap energy of the channel region and higher than the defects centers energy of the source/drain regions 30" to primarily thermal anneal an upper portion of the source/drain regions 30'. Following exposure to the first laser beam pulse, the upper portion of the source/drain regions 30" has been annealed while lower portions still contain lattice defects. The upper portion therefore has become more transparent to subsequent laser beam pulses than the lower portion. The exemplary partial annealing step is illustrated by the presence of more defect center markings "x" within the channel layer 20 portion of the source drain regions 30" than in the barrier layer 22 portion, thereby indicating that many of the defect centers in the barrier layer have been annealed.

A second laser beam pulse is then generated which has a wavelength with a photon energy that is less than the bandgap energy of the channel region and higher than the defects center energy of the source/drain regions 30''' to primarily thermal anneal a still lower portion of the source/drain regions. It is observed that the defect centers in the barrier layer 22 and some of the defect centers within the channel layer 20 have been annealed by the second pulse and, therefore, are absent in FIG. 7. A greater portion of the source/drain regions 30''' has thereby become more transparent to subsequent laser beam pulses.

A third laser beam pulse is then generated which has a wavelength with a photon energy that is less than the bandgap energy of the channel region and higher than the defects center energy of the source/drain regions 30 to primarily thermal anneal a remaining lower portion of the source/drain regions. It is observed that the remaining defect centers in the barrier layer 22 have been annealed by the third pulse and, therefore, are absent in FIG. 8.

It is to be understood that FIGS. 2, 3, 6, 7, and 8 illustrate the idealized effects of the laser beam pulses being able to anneal and activate the implanted impurity ions and related defect centers. It is to be understood that not all of the implanted impurity ions may be activated and related defect centers may be annealed by one or more laser beam pulses.

The sequence of laser beam pulses may have the same wavelength wavelength, intensity, and/or duration or any of these characteristics may differ from one pulse to another due to operational differences of the laser apparatus and/or under the control of a microprocessor. For example, the laser apparatus may be controlled to provide the lowest energy during the first pulse and subsequently higher energies in subsequent pulses or vice versa to control the temperature profile of the source/drain regions and/or the channel region during the annealing process and/or to control the temperature gradient that is created between the source/drain regions and peripheral portions of the stacked structure. In some embodiments, the sequence of laser beam pulses each have a wavelength between about 300 nm and about 400 nm to sequentially anneal different portions of the source/drain regions. In still further embodiments, the sequence of laser beam pulses each have a wavelength of about 380 nm.

Although various embodiments have been illustrated in FIGS. 1-8 that include a protective layer, it is to be understood that using the protective layer is optional and, accordingly, the protective layer may be omitted from the above figures.

While embodiments of the present invention have been described herein with reference to particular HEMT structures, the present invention should not be construed as limited to such structures, and may be applied to annealing implanted regions in many different transistor structures, such as pseudomorphic HEMTs (pHEMTs) (including GaAs/AlGaAs pHEMTs) and/or GaN MESFETs.

In the drawings and specification, there have been disclosed typical embodiments of the invention, and, although specific terms have been employed, they have been used in a generic and descriptive sense only and not for purposes of limitation.

That which is claimed:

1. A method of forming a Group III-nitride transistor device, the method comprising:
   implanting dopant ions into a stacked Group III-nitride channel layer and Group III-nitride barrier layer to form source/drain regions therein with a channel region therebetween, wherein the channel layer has a lower bandgap energy than the barrier layer along a heterojunction interface between the channel layer and the barrier layer, and the source/drain regions have a lower defect centers energy than the channel region; and
   exposing the source/drain regions and the channel region to a laser beam with a wavelength having a photon energy that is less than the bandgap energy of the channel region and higher than the defect centers energy of the source/drain regions to locally heat the source/drain regions to a temperature that anneals the source/drain regions.

2. The method of claim 1, further comprising:
   providing the channel layer and the barrier layer from materials that are substantially transparent to the wavelength of the laser beam.

3. The method of claim 2, wherein:
   the channel layer comprises gallium nitride;
   the barrier layer comprises aluminum gallium nitride; and
   the implanted dopant ions comprise silicon.

4. The method of claim 2, wherein the source/drain regions and the channel region are exposed to a laser beam with a wavelength between about 380 nm and about 600 nm to locally heat and anneal the source/drain regions.

5. The method of claim 1, wherein exposing the source/drain regions and the channel region to a laser beam comprises:
   heating the source/drain regions to a temperature of about 1000° C. to about 1300° C. while at least a majority of the channel region remains below 1000° C.

6. The method of claim 5, wherein exposing the source/drain regions and the channel region to a laser beam comprises:
   heating the source/drain regions to a temperature within a range between 1030° C. and 1200° C.

7. The method of claim 1, wherein exposing the source/drain regions and the channel region to a laser beam comprises:
   generating a sequence of laser beam pulses that are spaced apart in time and have one or more wavelengths each with a photon energy that is less than the bandgap energy of the channel region and higher than the defect centers energy of the source/drain regions to sequentially thermally anneal different portions of the source/drain regions.

8. The method of claim 7, wherein generating a sequence of laser beam pulses comprises:
    generating a first laser beam pulse having a wavelength with a photon energy that is less than the bandgap energy of the channel region and higher than the bandgap energy of the source/drain regions to primarily thermal anneal an upper portion of the source/drain regions; and
    generating a second laser beam pulse having a wavelength with a photon energy that is less than the bandgap energy of the channel region and higher than the defect centers energy of the source/drain regions to primarily thermal anneal a lower portion of the source/drain regions.

9. The method of claim 7, wherein generating a sequence of laser beam pulses comprises:
    generating a first laser beam pulse having a wavelength with a photon energy that is less than the bandgap energy of the channel region and higher than the defect centers energy of the source/drain regions to primarily thermal anneal a first portion of the source/drain regions having a highest dopant ion concentration; and
    generating a second laser beam pulse having a wavelength with a photon energy that is less than the bandgap energy of the channel region and higher than the defect centers energy of the source/drain regions to primarily thermal anneal a second portion of the source/drain regions having a lower dopant ion concentration than the first region.

10. The method of claim 1, wherein implanting dopant ions into a Group III-nitride channel layer and a Group III-nitride barrier layer to form source/drain regions therein with a channel region therebetween comprises:
    implanting the dopant ions to provide a peak dopant ion concentration of at least of $1 \times 10^{18}$ cm$^{-3}$ in the channel layer and/or the barrier layer to form the source/drain regions therein.

11. The method of claim 1, further comprising providing a protective layer directly on the barrier layer opposite to the channel layer to inhibit emission from the barrier layer while the source/drain regions and the channel region are exposed to the laser beam, wherein the dopant ions are implanted through the protective layer into the channel layer and the barrier layer to form the source/drain regions.

12. The method of claim 11, wherein the laser beam is directed through the protective layer to penetrate the source/drain regions and the channel region and to locally heat and anneal the source/drain regions.

13. The method of claim 1, further comprising preheating the channel layer and the barrier layer to above 100° C. and maintaining the channel layer and the barrier layer at one or more temperatures above 100° C. while exposing the source/drain regions and the channel region to the laser beam to reduce a temperature gradient between the locally heated source/drain regions and the channel region.

14. A method of forming a transistor device, the method comprising:
    implanting dopant ions into a stacked channel layer comprising gallium nitride and a barrier layer comprising aluminum gallium nitride to form source/drain regions therein with a channel region therebetween;
    exposing the source/drain regions and the channel region to a laser beam with a wavelength having a photon energy that is less than a defect centers energy of the channel region and higher than a bandgap energy of the source/drain regions to locally heat the source/drain regions to a temperature that anneals the source/drain regions.

15. The method of claim 14, wherein exposing the source/drain regions and the channel region to a laser beam comprises:
    generating a sequence of laser beam pulses that are spaced apart in time and have wavelength between about 380 nm and about 600 nm to sequentially thermally anneal different portions of the source/drain regions.

16. The method of claim 14, wherein generating a sequence of laser beam pulses comprises:
    generating a first laser beam pulse having a wavelength of about 380 nm to primarily thermal anneal an upper portion of the source/drain regions; and
    generating a second laser beam pulse having a wavelength of about 380 nm to primarily thermal anneal a lower portion of the source/drain regions.

* * * * *